United States Patent
Kosugi et al.

(10) Patent No.: US 7,444,606 B2
(45) Date of Patent: Oct. 28, 2008

(54) METHOD FOR DESIGNING SEMICONDUCTOR INTEGRATED CIRCUIT, SEMICONDUCTOR INTEGRATED CIRCUIT AND PROGRAM FOR DESIGNING SAME

(75) Inventors: Naoto Kosugi, Kawasaki (JP); Jiro Daijo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 664 days.

(21) Appl. No.: 11/066,497

(22) Filed: Feb. 28, 2005

(65) Prior Publication Data
US 2006/0117285 A1    Jun. 1, 2006

(30) Foreign Application Priority Data
Nov. 26, 2004    (JP) .............................. 2004-341676

(51) Int. Cl.
G06F 17/50    (2006.01)
G06F 1/12    (2006.01)
G06F 1/04    (2006.01)

(52) U.S. Cl. ............................ 716/6; 713/400; 713/500

(58) Field of Classification Search ..................... 716/6; 713/400, 500
See application file for complete search history.

(56) References Cited

U.S. PATENT DOCUMENTS 6,189,133 B1 *    2/2001    Durham et al. ............... 716/12

2003/0061584 A1 *    3/2003    Shih et al. ...................... 716/6

FOREIGN PATENT DOCUMENTS

| JP | 07-168652 | 7/1995 |
|---|---|---|
| JP | 08-076893 | 3/1996 |
| JP | 11-088306 | 3/1999 |

* cited by examiner

Primary Examiner—Stacy A Whitmore
Assistant Examiner—Magid Y Dimyan
(74) Attorney, Agent, or Firm—Arent Fox LLP

(57) ABSTRACT

In lower hierarchy design in which a plurality of circuit blocks are independently designed, a reset adjustment circuit propagating deactivation transition of a reset signal to flip-flops in synchronization with a clock signal is inserted immediately after a reset input pin in each circuit block, and timing adjustment using the clock signal as a reference is implemented for signal paths of the reset signal from the reset adjustment circuit to the flip-flops. In upper hierarchy design in which an entire semiconductor integrated circuit is designed, timing adjustment using the clock signal as a reference is implemented for signal paths of the reset signal, according to setup times and hold times of the reset signal that are prescribed respectively for the reset input pins of the circuit blocks.

18 Claims, 10 Drawing Sheets

US 7,444,606 B2

METHOD FOR DESIGNING SEMICONDUCTOR INTEGRATED CIRCUIT, SEMICONDUCTOR INTEGRATED CIRCUIT AND PROGRAM FOR DESIGNING SAME

CROSS REFERENCE TO RELATED APPLICATION

This application is based upon and claims the benefit of priority from Japanese Patent Application No. 2004-341676, filed on Nov. 26, 2004, the entire contents of which are incorporated herein by reference.

BACKGROUND OF THE INVENTION

1. Field of the Invention

The present invention relates to a semiconductor integrated circuit, and more particularly, to a technique of designing a reset signal in the semiconductor integrated circuit.

2. Description of the Related Art

In designing a large-scale LSI, as a method to effectively utilize intellectual property and reduce a design period, known is hierarchical design (hierarchical layout design) in which physical design (layout design) of each lower hierarchy block is independently implemented, and physical design of the entire LSI (upper hierarchy) is implemented, using the lower hierarchy blocks (including hard macro which is a library of layout data) whose physical design has been completed.

When the physical design of the lower hierarchy blocks is completed, the signal input time of an input signal (setup time and hold time) is prescribed for a signal input pin of each of the lower hierarchy blocks in order to guarantee normal operations of the lower hierarchy blocks, in consideration of manufacturing process conditions, an operational temperature range, an operational voltage range, and so on as well as the clock delay time from a clock input pin up to each flip-flop and the signal delay time from each signal input pin to each flip-flop. In upper hierarchy design, physical design of portions except the lower hierarchy blocks in the LSI (wiring among the lower hierarchy blocks and so on) is implemented so as to satisfy the setup times and the hold times that are prescribed respectively for the signal input pins of the lower hierarchy blocks.

Further, Japanese Unexamined Patent Application Publication No. Hei 8-76893 discloses a technology of surely resetting a synchronous reset circuit in response to a reset pulse and a clock irrespective of the duration of the reset pulse or the delay of the clock.

Japanese Unexamined Patent Application Publication No. Hei 7-168652 discloses a synchronous reset circuit realizing reduction in circuit scale and reduction in the number of pins of a data processor. In this synchronous reset circuit, an asynchronous reset signal is synchronized with a clock by a synchronization circuit, and from the reset signal synchronous with the clock, a plurality of delay circuits generate a plurality of reset signals different in activation timing, which are then supplied to a plurality of flip-flop groups respectively. This causes the plural flip-flop groups to be reset at different timings from one another. Further, a reset ending circuit synchronizes deactivation timings of the plural reset signals, so that all the flip-flops are concurrently released from the reset state.

Japanese Unexamined Patent Application Publication No. Hei 11-88306 discloses a technology of generating a synchronizing pulse signal from an asynchronous pulse signal even when a clock signal with a longer cycle than the pulse width of the asynchronous pulse signal is used.

The setup time and the hold time of an input signal that are prescribed for a signal input pin of a lower hierarchy block are proper values determined according to an internal structure of the lower hierarchy block. Therefore, if hierarchical design is implemented by combining a large number of lower hierarchy blocks, timing constraint (clock cycle or the like) cannot be sometimes satisfied (state of difficulty in timing closure) in upper hierarchy design since the setup time and the hold time are prescribed at different values respectively for the signal input pins of the plural lower hierarchy blocks receiving a common signal.

For example, a reset signal is a high fan-out signal (high fan-out net) propagated from an upper hierarchy to flip-flops in each of the lower hierarchy blocks via a reset input pin of each of the lower hierarchy blocks. Further, the number of the flip-flops included in the lower hierarchy block and circuit scale or the clock delay time in the lower hierarchy block greatly differ among lower hierarchy blocks. Therefore, there tends to occur variation in the setup time and the hold time of the reset signal that are prescribed for the reset input pins of the respective lower hierarchy blocks. Further, in order to surely prevent a malfunction of an LSI, it is generally necessary to implement the design of the reset signal so that all the flip-flops can be released from the reset state during the same clock cycle. Therefore, the smaller the clock cycle is, the more severe timing constraint on the reset signal is.

One of known methods of adjusting the timing of the high fan-out signal such as the reset signal is a method of adopting a tree structure to paths of the reset signal, as is often applied to a clock signal. This method is effective in a case where the reset signals are collectively designed in the entire LSI, but in a case of the hierarchical design, the tree structure cannot be adopted to portions included in the lower hierarchy blocks since the paths of the reset signal include inner parts of the lower hierarchy blocks whose physical design has been completed. For this reason, a timing adjustment effect by the adoption of the tree structure is limited. Consequently, it requires a large number of man-hours to design the reset signal. This results in a longer design period of the LSI and increased product cost.

Another known method is a method of suppressing the setup time and the hold time of an input signal that are prescribed for a signal input pin. For example, by reducing the number of logic stages between the signal input pin and a first-stage flip-flop as much as possible, variation in the setup time and the hold time of the input signal can be reduced. This method is effective for a general signal synchronizing with a clock signal, but is not effective for a signal such as a reset signal that is not synchronized with the clock signal and is supplied from a reset input pin directly to a reset pin of each flip-flop.

SUMMARY OF THE INVENTION

It is an object of the present invention to make the setup time and the hold time of a reset signal that are prescribed for each reset input pin small and constant irrespective of a circuit configuration. It is another object of the present invention to facilitate designing a reset signal in hierarchical design of a semiconductor integrated circuit. It is still another object of the present invention to shorten the development period of a semiconductor integrated circuit and to curtail product cost.

According to a first aspect of the present invention, for example, a computer for designing a semiconductor integrated circuit executes the following processing for a semiconductor integrated circuit having a plurality of flip-flops that are reset in response to activation transition of a reset signal from a reset input pin.

First, a reset adjustment circuit is inserted immediately after the reset input pin (first step). The reset adjustment circuit is a circuit that propagates deactivation transition of the reset signal, which is inputted from the reset input pin, to the flip-flops in synchronization with a clock signal supplied to the flip-flops. Then, timing adjustment using the clock signal as a reference is implemented for paths of the reset signal from the reset adjustment circuit to the flip-flops (second step). That is, clock synchronization design is implemented for the paths of the reset signal from the reset adjustment circuit to the flip-flops. Consequently, for example, first timing adjustment circuits that adjust delay times of the paths of the reset signal using the clock signal as a reference are inserted in the paths of the reset signal from the reset adjustment circuit to the flip-flops.

The reset adjustment circuit is inserted to propagate the deactivation transition of the reset signal to the flip-flops in synchronization with the clock signal, and the clock synchronization design is implemented for the paths of the reset signal from the reset adjustment circuit to the flip-flops, so that it is possible to surely release all the flip-flops from the reset state during the same cycle of the clock signal. Further, the setup time and the hold time of the reset signal that are prescribed for the reset input pin are determined based only on the signal delay time from the reset input pin to the reset adjustment circuit and on the clock delay time from the clock input pin to the reset adjustment circuit. Therefore, the setup time and the hold time of the reset signal that are prescribed for the reset input pin can be made small and constant, irrespective of the number of the flip-flops in the semiconductor integrated circuit or the kind and circuit scale of the semiconductor integrated circuit.

According to a second aspect of the present invention, for example, a computer for designing a semiconductor integrated circuit executes the following processing. First, in a lower hierarchy design step of independently designing a plurality of circuit blocks each having a plurality of flip-flops that are reset in response to activation transition of a reset signal from a reset input pin, each of the circuit blocks is subjected to the aforesaid first and second steps.

Then, in an upper hierarchy design step of designing an entire semiconductor integrated circuit having the plural circuit blocks, timing adjustment using a clock signal as a reference is implemented for paths of the reset signal to the reset input pins of the circuit blocks, according to setup times and hold times of the reset signal that are prescribed respectively for the reset input pins of the circuit blocks (third step). That is, clock synchronization design is implemented for the paths of the reset signal to the reset input pins of the circuit blocks. Consequently, for example, second timing adjustment circuits adjusting the delay time of the paths of the reset signal using the clock signal as a reference are inserted in the paths of the reset signal to the reset input pins of the circuit blocks.

The setup time and the hold time of the reset signal that are prescribed respectively for the reset input pins of the circuit blocks can be made small and constant, so that timing constraint on the reset signal in the upper hierarchy design can be relaxed. Consequently, in the upper hierarchy design, even when the cycle of the clock signal is small, the timing adjustment for the paths of the reset signal can be implemented easily. In other words, designing the reset signal can be facilitated. Therefore, the development period of the semiconductor integrated circuit can be shortened and product cost can be curtailed.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Figure 1:
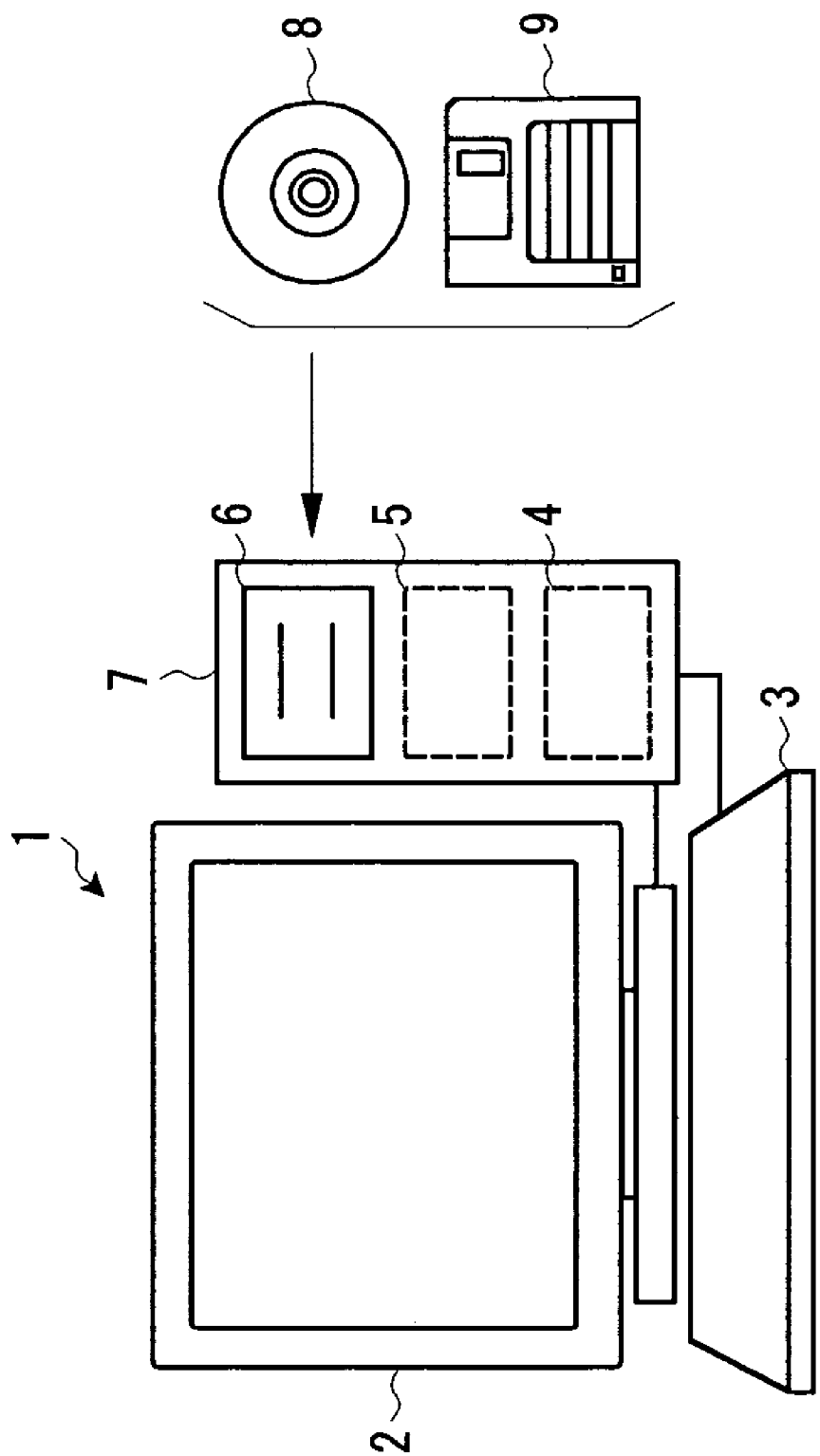
FIG. 1 is an explanatory view showing a configuration example of a system to realize the present invention.

In a preferable example of the first or the second aspect of the present invention, a first synchronization circuit of the reset adjustment circuit outputs as a first internal signal the reset signal from the reset input pin, in synchronization with the clock signal. A logic operation circuit of the reset adjustment circuit activates an internal reset signal to be supplied to the flip-flips, in synchronization with the activation transition of the reset signal. The logic operation circuit deactivates the internal reset signal in synchronization with deactivation transition of the first internal signal. Therefore, the activation timing of the internal reset signal is the same as that of the reset signal, and is irrespective of the clock signal. On the other hand, the deactivation timing of the internal reset signal is the same as that of the first internal signal and is synchronous with the clock signal. Therefore, if the timing adjustment using the clock signal as a reference is implemented for the signal paths from the first synchronization circuit to the flip-flops, it is possible to surely release all the flip-flops from the reset state during the same cycle of the clock signal.

In a preferable example of the first or the second aspect of the present invention, a second synchronization circuit of the reset adjustment circuit outputs as a second internal signal the first internal signal supplied from the first synchronization circuit, in synchronization with the clock signal. The logic operation circuit receives as the first internal signal the second internal signal supplied from the second synchronization circuit. The reset signal from the reset input pin is thus received by the two-stage synchronization circuits connected in series, so that the internal reset signal to be supplied to the flip-flops can be surely generated even when the reset signal is not stable.

In a preferable example of the first or the second aspect of the present invention, an internal reset generating circuit of the reset adjustment circuit activates an internal reset signal to be supplied to the flip-flops, during activation of the reset signal from the reset input pin. The internal reset generating circuit outputs a signal fixed at deactivation level of the internal reset signal as the internal reset signal during deactivation of the reset signal in synchronization with the clock signal. Therefore, the activation timing of the internal reset signal is the same as that of the reset signal and is irrespective of the clock signal. On the other hand, the deactivation timing of the internal signal is synchronous with the clock signal immediately after the deactivation of the reset signal. Therefore, if timing adjustment using the clock signal as a reference is implemented for signal paths from the internal reset generating circuit to the flip-flops, it is possible to surely release all the flip-flops from the reset state during the same cycle of the clock signal.

Hereinafter, embodiments of the present invention will be described, using the drawings.

FIG. 1 shows a configuration example of a system to realize the present invention. The system to realize the present invention includes, for example, a computer such as a work station 1 and storage media such as a CD-ROM 8 and a flexible disk 9 on which a program for designing a semiconductor integrated circuit of the present invention is recorded. The work station 1 has a display 2 implementing screen display, a keyboard 3 inputting an instruction by key pressing, a CPU 4, and a controller 7 in which a hard disk 5 and a recording medium drive device 6 are built in. The CD-ROM 8 or the flexible disk 9 is loadable in the recording medium drive device 6. After the CD-ROM 8 or the flexible disk 9 is loaded in the recording medium drive device 6, the work station 1 downloads the program recorded on the CD-ROM 8 or the flexible disk 9 to a hard disk 5 in response to an instruction inputted via the keyboard 3. The CPU 4 of the work station 1 executes the program stored on the hard disk 5 to implement the design (layout design) of a semiconductor integrated circuit.

Figure 2:
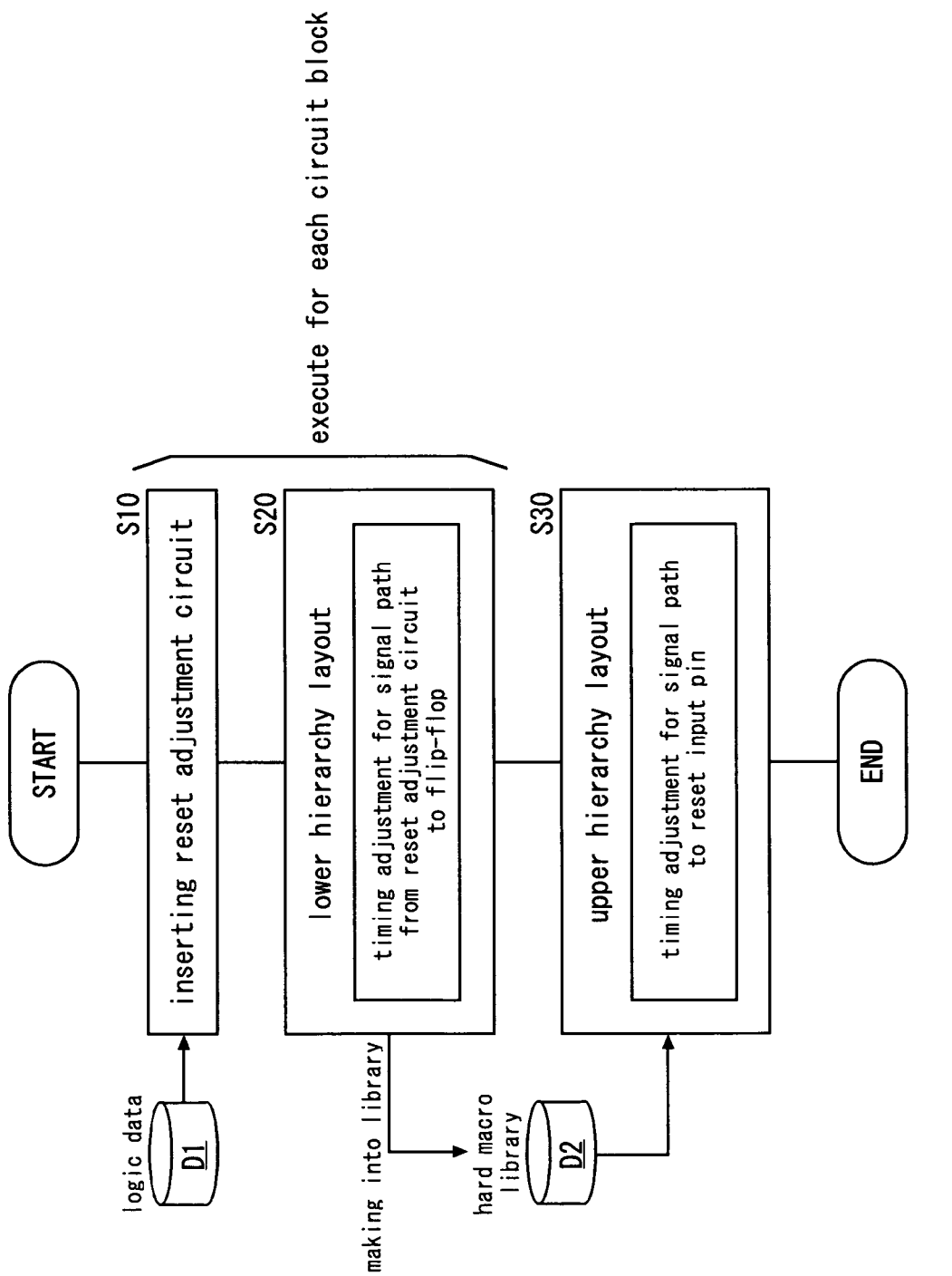
FIG. 2 is a flowchart showing a method for designing a semiconductor integrated circuit of a first embodiment.

FIG. 2 to FIG. 5 show a first embodiment of the present invention. FIG. 2 shows a method for designing a semiconductor integrated circuit of the first embodiment. For implementing this design method, for example, the CPU 4 of the work station 1 in FIG. 1 executes the program stored on the hard disk 5. The CPU 4 executes Steps S10, S20 for each circuit block as a lower hierarchy design step, using logic data D1 (net list or RTL data) of a semiconductor integrated circuit having a plurality of circuit blocks, and thereafter executes Step S30 as an upper hierarchy design step. Here, each of the circuit blocks has a plurality of flip-flops of an asynchronous reset type that operate in synchronization with a clock signal from a clock input pin, and that are reset in response to activation transition of a reset signal from a reset input pin.

At Step S10 (first step), the CPU 4 uses the logic data D1 of the semiconductor integrated circuit to insert a reset adjustment circuit immediately after the reset input pin in the circuit block to be processed. Here, the reset adjustment circuit is a circuit that propagates deactivation transition of the reset signal to the flip-flops in synchronization with the clock signal supplied to the flip-flops. Thereafter, the process shifts to Step S20.

At Step S20 (second step), the CPU 4 uses logic data in which the reset adjustment circuit is inserted at Step S10, to implement layout of the circuit block to be processed (lower hierarchy layout). At this time, the CPU 4 implements timing adjustment using the clock signal as a reference (clock synchronization design), for paths of the reset signal from the reset adjustment circuit to the flip-flops. Thereafter, the process shifts to Step S30. Note that layout data of the circuit block obtained at Step S20 is made into a library as, for example, hard macro.

At Step S30 (third step), the CPU 4 combines the layout data of the circuit blocks obtained at Steps S10, S20 or the layout data in a hard macro library D2 to implement layout of the entire semiconductor integrated circuit (upper hierarchy layout). At this time, according to the setup time and the hold time of the reset signal prescribed for the reset input pin of each of the circuit blocks, the CPU 4 implements timing adjustment using the clock signal as a reference (clock synchronization design), for signal paths of the reset signal up to the reset input pins of the circuit blocks. This completes the design of the semiconductor integrated circuit.

Figure 3:
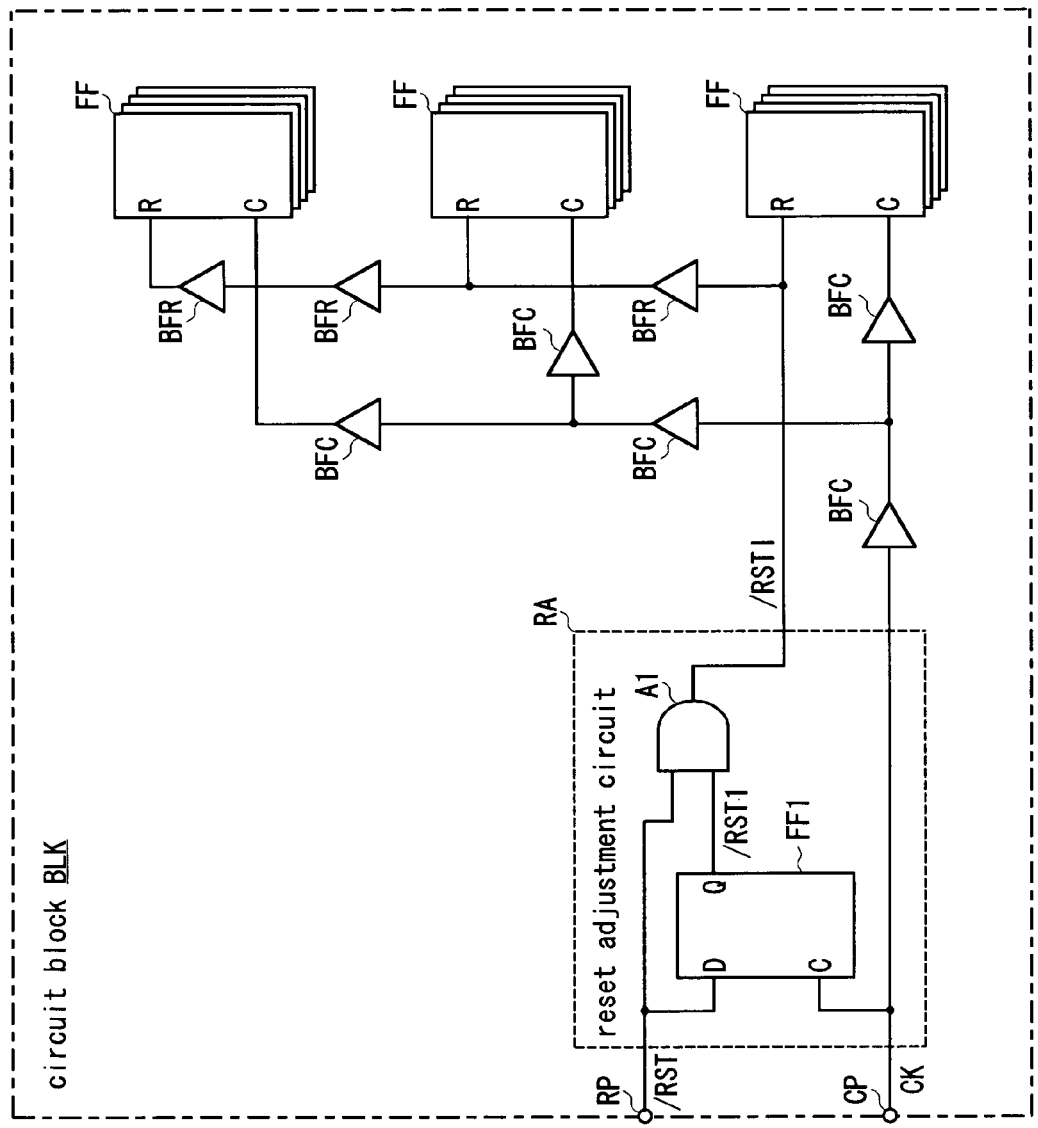
FIG. 3 is an explanatory diagram showing an example of a circuit block of the first embodiment.

FIG. 3 shows an example of the circuit block designed through Steps S10, S20 in FIG. 2. A circuit block BLK has a reset adjustment circuit RA inserted at Step S10, a plurality of flip-flops FF, a plurality of buffers BFC, BFR (first timing adjustment circuits) inserted at Step S20.

The reset adjustment circuit RA has a flip-flop FF1 (first synchronization circuit) and an AND circuit A1. A data input pin D of the flip-flop FF1 receives a reset signal /RST with negative logic supplied from a reset input pin RP of the circuit block BLK. A clock pin C of the flip-flop FF1 receives a clock signal CK supplied from a clock input pin CP of the circuit block BLK. The flip-flop FF1 takes in the reset signal /RST in synchronization with rising edges of the clock signal CK to output the taken signal as a reset signal /RST1 (first internal signal) from a data output pin Q. The AND circuit A1 activates a reset signal /RST1 (internal reset signal) to be supplied to the flip-flop FF to low level when at least one of the reset signals /RST, /RST1 is at low level (active level).

A reset pin R of each of the flip-flops FF receives the reset signal /RST1 outputted from the reset adjustment circuit RA (AND circuit A1) directly or via the buffer(s) BFR. The clock pin C of each of the flip-flops FF receives the clock signal CK via the buffers BFC. The buffers BFC are provided so as to form a tree structure of the clock signal CK and to synchronize the arrival times of the clock signal CK at the flip-flops FF. The buffers BFR are provided so as to form a tree structure of the reset signal /RST and to synchronize the arrival times of deactivation transition of the reset signal /RST1 (that is, deactivation transition of the reset signal /RST1) at the flip-flops.

Figure 4:
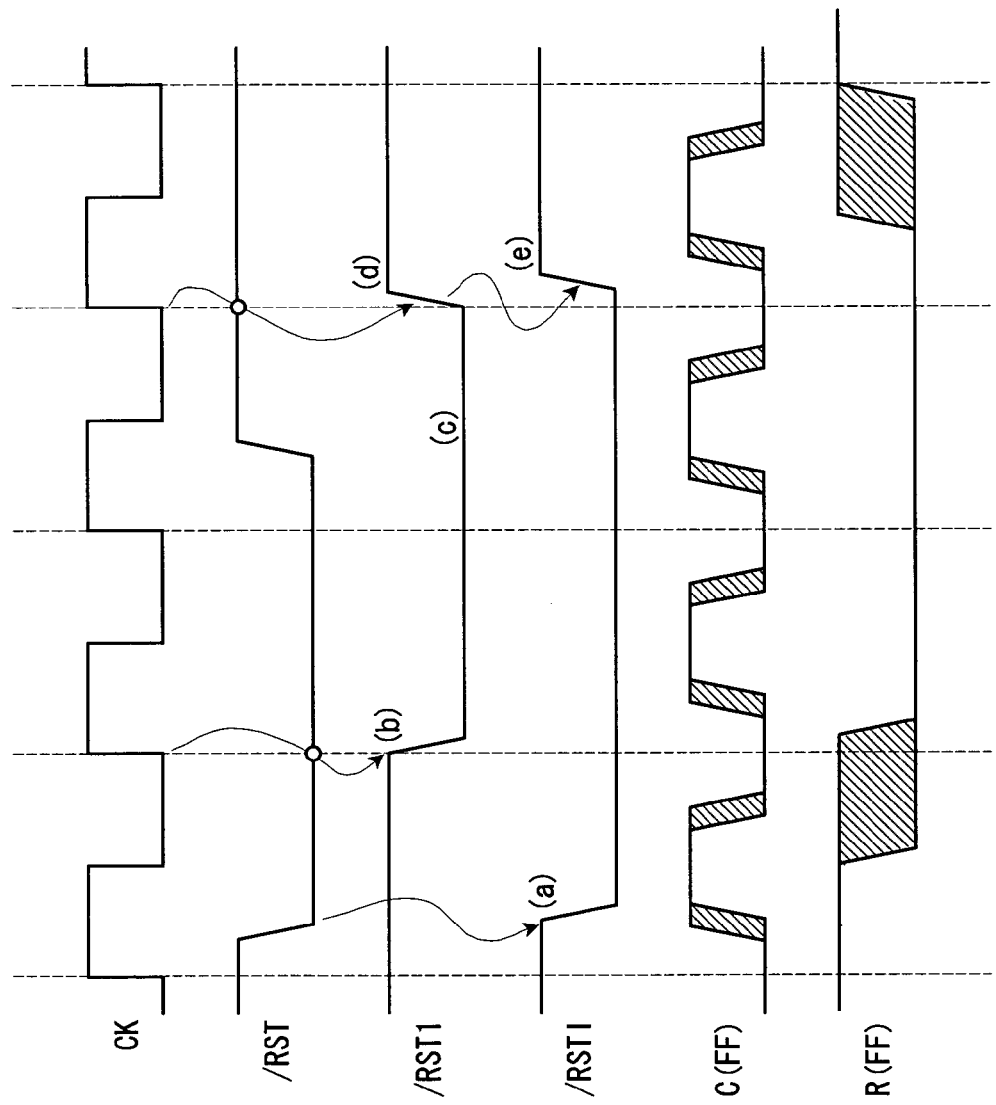
FIG. 4 is a timing chart showing operations of a reset adjustment circuit of the first embodiment.

FIG. 4 shows operations of the reset adjustment circuit RA of the first embodiment. When the reset signal /RST supplied from the reset input pin RP of the circuit block BLK changes from high level to low level, the reset signal /RST1 outputted from the AND circuit A1 changes from high level to low level (FIG. 4(*a*)). Then, when a rising change of the clock signal CK occurs, the reset signal /RST1 outputted from the flip-flop FF1 changes from high level to low level since the reset signal /RST is at low level (FIG. 4(*b*)).

Thereafter, even when the reset signal /RST changes from low level to high level, the reset signal /RST1 does not change from low level since the reset signal /RST1 is at low level (FIG. 4(*c*)). Then, when a next rising change of the clock signal CK occurs, the reset signal /RST1 changes from low level to high level since the reset signal /RST is at high level (FIG. 4(*d*)). At this time, since the reset signals /RST, /RST1 are both at high level, the reset signal /RST1 also changes from low level to high level (FIG. 4(*e*)).

In this manner, the reset signal /RST1 outputted from the AND circuit A1 changes from high level to low level in synchronization with falling edges of the reset signal /RST, and changes from low level to high level in synchronization with rising edges of the reset signal /RST1, i.e., rising edges of the clock signal CK. In addition, since the clock synchronization design is implemented for signal paths from the data output pin Q of the flip-flop FF1 in the reset adjustment circuit RA up to the reset pins R of the flip-flops FF, all the flip-flops FF in the circuit block BLK are surely released from the reset state during the same clock cycle. Note that the hatched portions in signal forms of the clock pin C and the reset pin R of the flip-flop FF represent skews among the flip-flops FF.

Further, the setup time and the hold time of the reset signal /RST that are prescribed for the reset input pin RP are determined by the delay time of the reset signal /RST from the reset input pin RP to the data input pin D of the flip-flop FF and by the delay time of the clock signal CK from the clock input pin CP to the clock pin C of the flip-flop FF1. Therefore, the setup time and the hold time of the reset signal /RST are small values and are substantially constant irrespective of the kind (function) and the circuit scale of the circuit block BLK.

Figure 5:
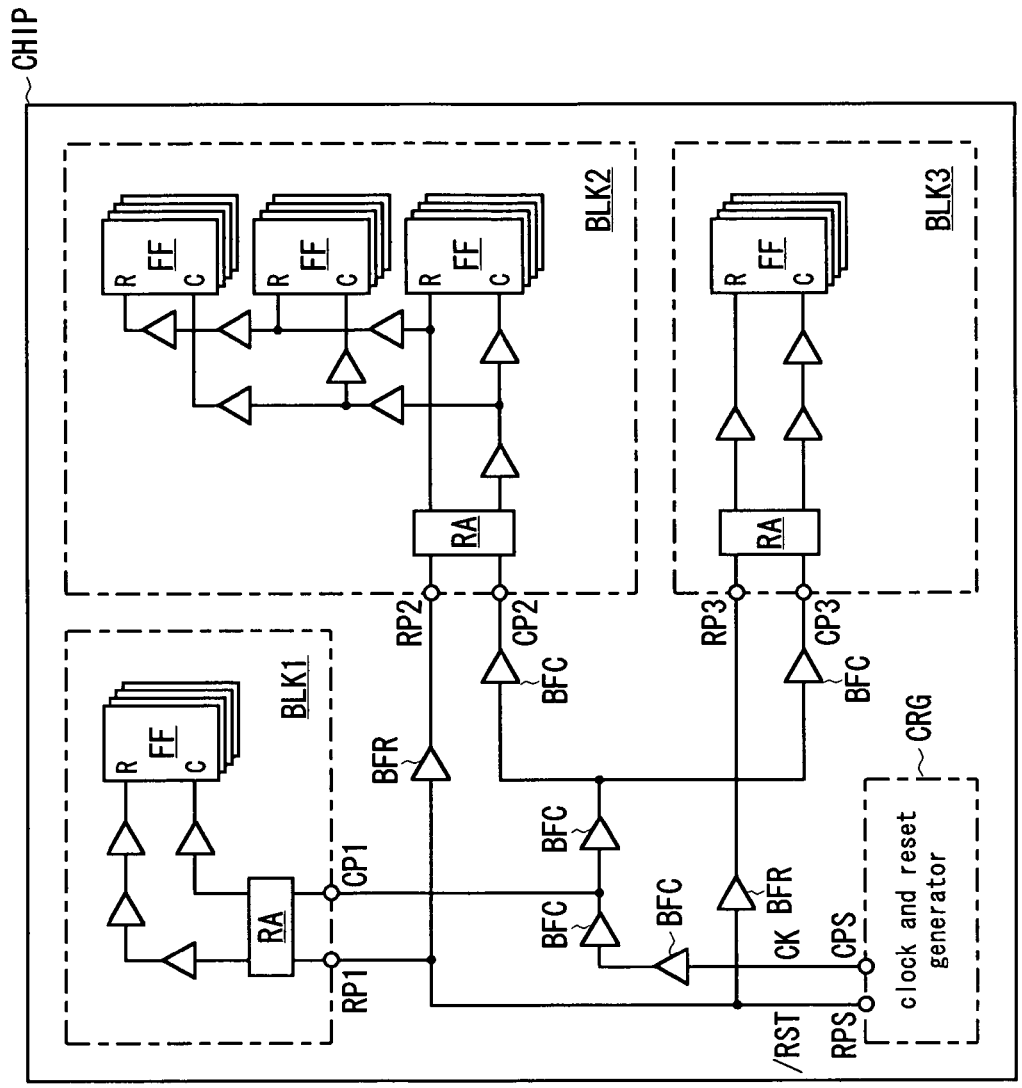
FIG. 5 is an explanatory diagram showing an example of a semiconductor integrated circuit of the first embodiment.

FIG. 5 shows an example of a semiconductor integrated circuit designed through Steps S10 to S30 in FIG. 2. A semiconductor integrated circuit chip CHIP has a clock and reset generator CRG, circuit blocks BLK1 to BLK3 each designed through Steps S10, S20, and a plurality of buffers BFC, BFR (second timing adjustment circuits) inserted at Step S30. The clock and reset generator CRG outputs a clock signal CK from a clock output pin CPS, the clock signal CK being generated, for example, based on an external clock signal supplied via an input/output buffer (not shown) of the semiconductor integrated circuit chip CHIP. The clock and reset generator CRG also outputs an external reset signal, which is supplied via, for example, the input/output buffer of the semiconductor integrated circuit chip CHIP, as a reset signal /RST from a reset output pin RPS in synchronization with the clock signal CK.

The circuit blocks BLK1 to BLK 3 are the same as the circuit block BLK in FIG. 3 except that a circuit configuration for embodying functions (the number of flip-flips and the like) is different. The buffers BFC are provided so as to form a tree structure of the clock signal CK and to synchronize the arrival times of the clock signal CK at clock input pins CP1 to CP3. The buffers BFR are provided so as to form a tree structure of the reset signal /RST and so that the arrival times of deactivation transition of the reset signal /RST at reset input pins RP1 to RP3 satisfy the setup time and the hold time of the reset signal /RST that are prescribed for each of the reset input pins RP1 to RP3.

Figure 6:
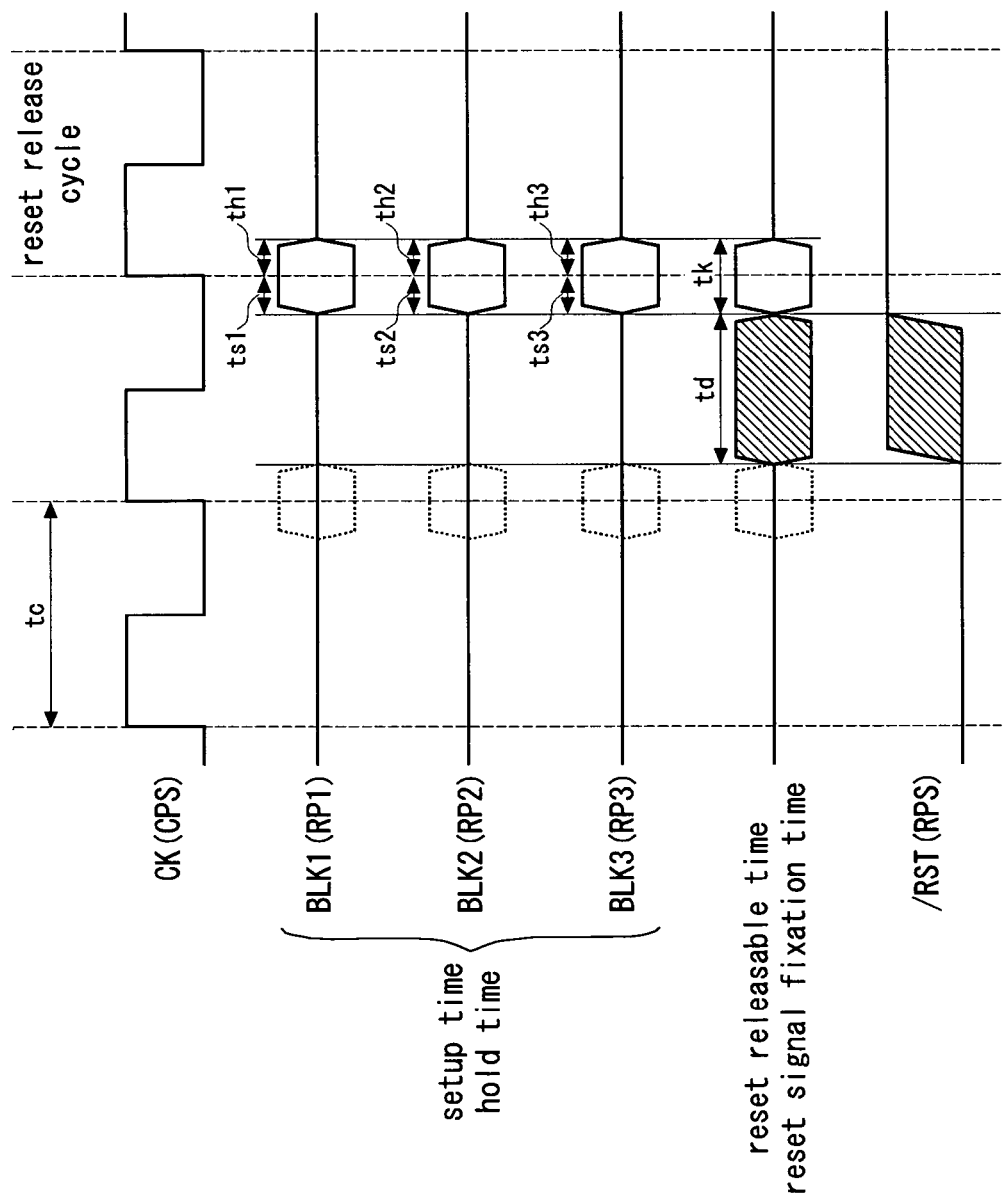
FIG. 6 is an explanatory chart showing an overview of a reset signal in the first embodiment.

FIG. 6 shows an overview of the reset signal /RST in the first embodiment. Setup times ts1 to ts3 and hold times th1 to th3 of the reset signal RST that are prescribed respectively for the reset input pins RP1 to RP3 of the circuit blocks BLK1 BLK3 are small values and substantially the same irrespective of the circuit configuration of the circuit blocks (the number of the flip-flops), so that a reset signal fixation time tk (the time period during which deactivation transition of the reset signal /RST is prohibited) is small, in other words, a reset releasable time td (the time period during which deactivation transition of the reset signal /RST is permitted) is large. Consequently, timing constraint on the reset signal /RST in the upper hierarchy layout is relaxed, and even in consideration of the fact that the transition timing of the reset signal /RST varies according to change in manufacturing process conditions, a temperature condition, a voltage condition, and so on, timing adjustment of the reset signal /RST (formation of the tree structure by the buffers BFC) is implemented easily.

Figure 7:
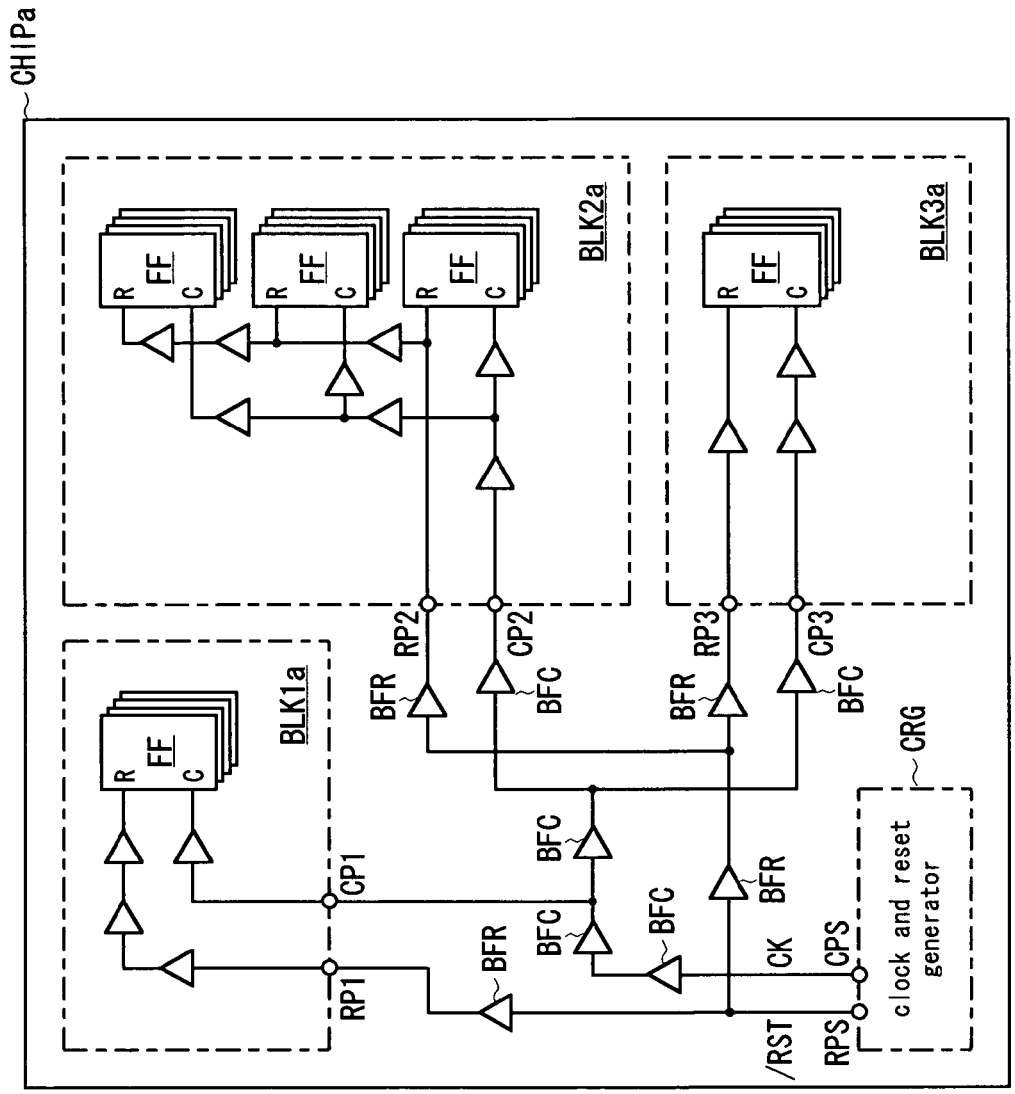
FIG. 7 is an explanatory diagram showing a comparative example of the present invention.

FIG. 7 shows a comparative example of the present invention. A semiconductor integrated circuit chip CHIPa is the same as the semiconductor integrated circuit cihp CHIP except that it has circuit blocks BLK1a to BLK3a instead of the circuit blocks BLK1 to BLK3 in FIG. 5 and that the tree structure of the reset signal /RST is different. The circuit blocks BLK1a to BLK3a are the same as the circuit blocks BLK1 to BLK3 in FIG. 5 except that they do not have the reset adjustment circuit RA.

Figure 8:
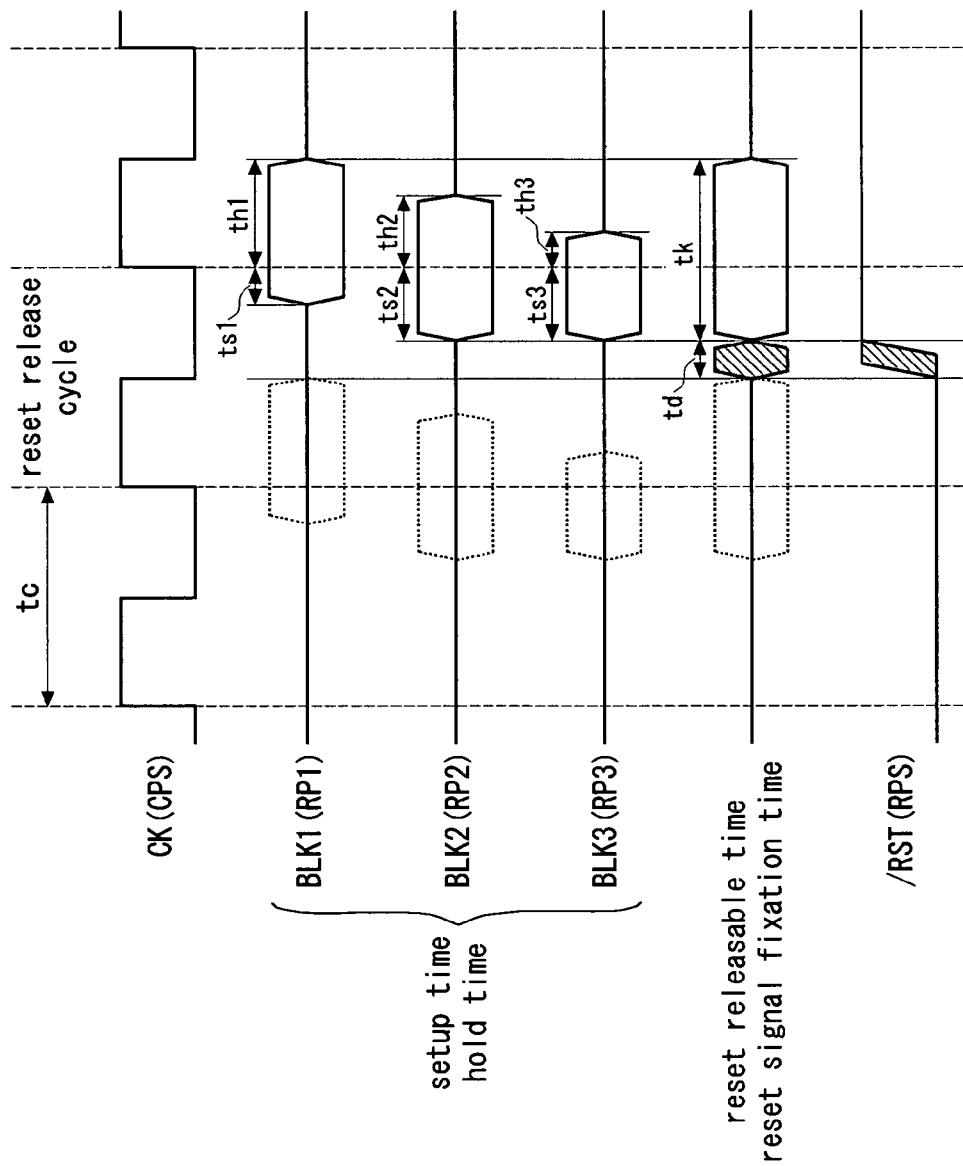
FIG. 8 is an explanatory chart showing an overview of a reset signal in the comparative example of the present invention.

FIG. 8 shows an overview of a reset signal in the comparative example of the present invention. Since the circuit blocks BLK1a to BLK3a do not have the reset adjustment circuit RA, different setup times ts1 to ts3 and different hold times th1 to th3 of a reset signal /RST are prescribed respectively for reset input pins RP1 to RP3 according to circuit configurations of the circuit blocks BLK1a to BLK3a (the number of flip-flops, clock delay, and so on). In order to release all flip-flops FF from the reset state during the same cycle of a clock signal CK, it is necessary to deactivate the reset signal /RST during a reset releasable time td, but the reset releasable time td of the reset signal /RST is a very short time compared with a clock cycle tc. In consideration of the fact that transition timing of the reset signal /RST varies according to change in manufacturing process conditions, a temperature condition, a voltage condition, and so on, very subtle timing adjustment is required for designing the reset signal /RST so that the reset signal /RST is deactivated during such a short time td, and the shorter the clock cycle tc is, the more difficult timing design of the reset signal /RST is.

In the first embodiment described above, the setup times and the hold times of the reset signal /RST that are prescribed respectively for the reset input pins RP1 to RP3 of the circuit blocks BLK1 to BLK3 can be made small and constant irrespective of the internal structures of the circuit blocks BLK1 to BLK3, so that designing the reset signal /RST in the upper hierarchy design can be facilitated. This can greatly contribute to reduction in the development period of a semiconductor integrated circuit and reduction in production cost, and in particular, when a semiconductor integrated circuit has a large number of circuit blocks and when clock frequency is high, a great effect can be brought about.

Figure 9:
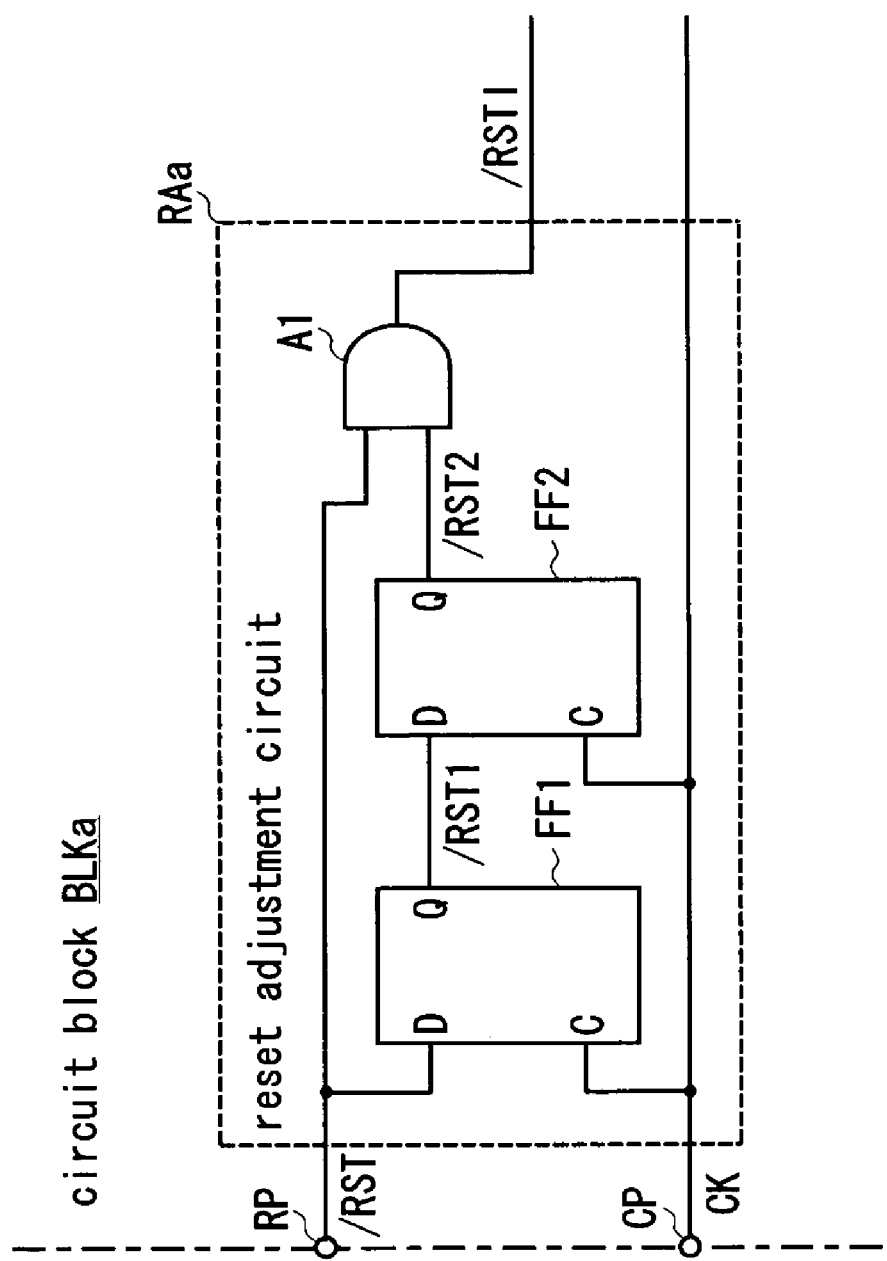
FIG. 9 is an explanatory diagram showing a second embodiment of the present invention.

FIG. 9 shows a second embodiment of the present invention. In describing the second embodiment, the same reference numerals or symbols are used to designate the same elements as the elements described in the first embodiment, and detailed description thereof will be omitted. The second embodiment is the same as the first embodiment except that the configuration of a reset adjustment circuit inserted in each circuit block is different.

A reset adjustment circuit RAa of the second embodiment is configured such that a flip-flop FF2 (second synchronization circuit) is added in the reset adjustment circuit RA of the first embodiment (FIG. 3). The flip-flop FF2 receives a clock signal CK supplied from a clock input pin CP at its clock pin C and also receives a reset signal /RST1 outputted from a flip-flop FF1 at its data input pin D. In synchronization with rising edges of the clock signal CK, the flip-flop FF2 takes in the reset signal /RST1 outputted from the flip-flop FF1 and outputs the taken signal as a reset signal /RST2 (second internal signal) from a data output pin Q. An AND circuit A1 receives a reset signal /RST2 outputted from the flip-flop FF2, instead of the reset signal /RST1 outputted from the flip-flop FF1.

In the reset adjustment circuit RAa as structured above, the deactivation timing of the reset signal /RST1 is delayed by one cycle of the clock signal CK than that of the first embodiment (FIG. 4), but similarly to the first embodiment, all flip-flops are released from the reset state during the same cycle of the clock signal CK.

The second embodiment described above can provide the same effects as those of the first embodiment. In addition, the reset adjustment circuit RAa receives the reset signal /RST at the two-stage flip-flops FF1 FF2, so that the reset signal /RST1 to be supplied to the flip-flops FF can be stably generated even when the reset signal /RST is not stable.

Figure 10:
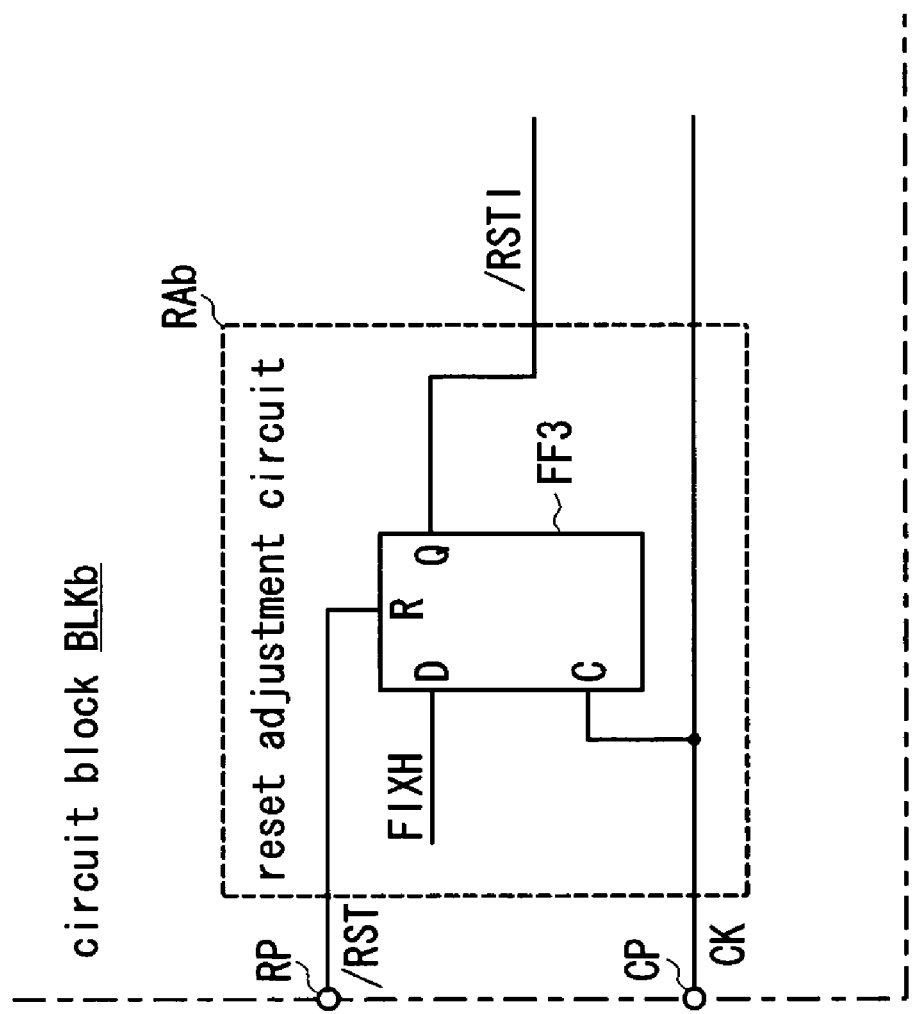
FIG. 10 is an explanatory diagram showing a third embodiment of the present invention.

FIG. 10 shows a third embodiment of the present invention. In describing the third embodiment, the same reference numerals or symbols are used to designate the same elements as the elements described in the second embodiment, and detailed description thereof will be omitted. The third embodiment is the same as the first embodiment except that the configuration of a reset adjustment circuit inserted in each circuit block is different.

A reset adjustment circuit RAb of the third embodiment has a flip-flop FF3 (internal reset generating circuit) having a reset pin R. The flip-flop FF3 receives a clock signal CK and a reset signal /RST at its clock pin C and reset pin R respectively, and receives a signal FIXH fixed at high level (deactivation level of a reset signal /RST1 to be supplied to flip-flops FF) at its data input pin D. The flip-flop FF3 fixes the reset signal /RST1 to be outputted from a data output pin Q at low level when the reset signal /RST is at low level. The flip-flop FF3 takes in the signal FIXH in synchronization with rising edges of the clock signal CK when the reset signal /RST is at high level, and outputs the taken signal as the reset signal /RST1. Also in the reset adjustment circuit RAb thus structured, the reset signal /RST1 to be supplied to the flip-flops FF is activated and deactivated at the same timings as those of the first embodiment (FIG. 4).

The third embodiment described above can also provide the same effects as those of the first embodiment.

The invention is not limited to the above embodiments and various modifications may be made without departing from the spirit and scope of the invention. Any improvement may be made in part or all of the components.

What is claimed is:

1. A method for designing a semiconductor integrated circuit comprising the steps of:
    inserting a reset adjustment circuit immediately after a reset input pin in a semiconductor integrated circuit which has a plurality of flip-flops that are reset in response to activation transition of a reset signal from the reset input pin, the reset adjustment circuit propagating deactivation transition of the reset signal to the flip-flops in synchronization with a clock signal supplied to the flip-flops; and
    implementing delay time adjustment for paths of the reset signal, using the clock signal as a reference, the paths extending from the reset adjustment circuit to the flip-flops.

2. The method for designing the semiconductor integrated circuit according to claim 1, wherein the reset adjustment circuit comprises:
    a first synchronization circuit outputting the reset signal as a first internal signal in synchronization with the clock signal; and
    a logic operation circuit activating an internal reset signal to be supplied to the flip-flips, in synchronization with the activation transition of the reset signal, and deactivating the internal reset signal in synchronization with deactivation transition of the first internal signal.

3. The method for designing the semiconductor integrated circuit according to claim 2, wherein:
    the reset adjustment circuit includes a second synchronization circuit outputting the first internal signal as a second internal signal in synchronization with the clock signal; and
    the logic operation circuit receives the second internal signal as the first internal signal.

4. The method for designing the semiconductor integrated circuit according to claim 1, wherein the reset adjustment circuit includes an internal reset generating circuit that activates an internal reset signal to be supplied to the flip-flops, during activation of the reset signal and outputs a signal fixed at deactivation level of the internal reset signal as the internal reset signal during deactivation of the reset signal in synchronization with the clock signal.

5. A method for designing a semiconductor integrated circuit comprising:
    a lower hierarchy design step of independently designing a plurality of circuit blocks each having a plurality of flip-flops that are reset in response to activation transition of a reset signal from a reset input pin; and
    an upper hierarchy design step of designing an entire semiconductor integrated circuit having the plurality of circuit blocks, wherein: said lower hierarchy design step comprises:
    a first step of inserting a reset adjustment circuit immediately after the reset input pin in each of the circuit blocks, the reset adjustment circuit propagating deactivation transition of the reset signal to the flip-flops in synchronization with a clock signal supplied to the flip-flops; and
    a second step of implementing delay time adjustment for paths of the reset signal, using the clock signal as a reference, the paths extending from the reset adjustment circuit to the flip-flops; and
    said upper hierarchy design step comprises a third step of implementing timing adjustment for paths of the reset signal using the clock signal as a reference according to setup times and hold times of the reset signal that are prescribed respectively for the reset input pins of the circuit blocks, the paths extending to the reset input pins of the circuit blocks.

6. The method for designing the semiconductor integrated circuit according to claim 5, wherein the reset adjustment circuit comprises:
    a first synchronization circuit outputting the reset signal as a first internal signal in synchronization with the clock signal; and
    a logic operation circuit activating an internal reset signal to be supplied to the flip-flips, in synchronization with the activation transition of the reset signal, and deactivating the internal reset signal in synchronization with deactivation transition of the first internal signal.

7. The method for designing the semiconductor integrated circuit according to claim 6, wherein:
    the reset adjustment circuit includes a second synchronization circuit outputting the first internal signal as a second internal signal in synchronization with the clock signal; and
    the logic operation circuit receives the second internal signal as the first internal signal.

8. The method for designing the semiconductor integrated circuit according to claim 5, wherein the reset adjustment circuit includes an internal reset generating circuit that activates an internal reset signal to be supplied to the flip-flops, during activation of the reset signal and outputs a signal fixed at deactivation level of the internal reset signal as the internal reset signal during deactivation of the reset signal in synchronization with the clock signal.

9. A semiconductor integrated circuit comprising:
    a plurality of flip-flops that are reset in response to activation transition of a reset signal from a reset input pin;
    a reset adjustment circuit provided immediately after the reset input pin and propagating deactivation transition of the reset signal to said flip-flops in synchronization with a clock signal supplied to said flip-flops; and a first delay time adjustment circuit adjusting delay times of paths of the reset signal, using the clock signal as a reference, the paths extending from said reset adjustment circuit to said flip-flops.

10. The semiconductor integrated circuit according to claim 9, wherein the reset adjustment circuit comprises: a first synchronization circuit outputting the reset signal as a first internal signal in synchronization with the clock signal; and a logic operation circuit activating an internal reset signal to be supplied to the flip-flips, in synchronization with the activation transition of the reset signal, and deactivating the internal reset signal in synchronization with deactivation transition of the first internal signal.

11. The semiconductor integrated circuit according to claim 10, wherein:

the reset adjustment circuit includes a second synchronization circuit outputting the first internal signal as a second internal signal in synchronization with the clock signal; and the logic operation circuit receives the second internal signal as the first internal signal.

12. The semiconductor integrated circuit according to claim 9, wherein the reset adjustment circuit includes an internal reset generating circuit that activates an internal reset signal to be supplied to the flip-flops, during activation of the reset signal and outputs a signal fixed at deactivation level of the internal reset signal as the internal reset signal during deactivation of the reset signal in synchronization with the clock signal.

13. A semiconductor integrated circuit comprising: a plurality of circuit blocks each comprising:

a plurality of flip-flops that are reset in response to activation transition of a reset signal from a reset input pin;

a reset adjustment circuit provided immediately after the reset input pin and propagating deactivation transition of the reset signal to the flip-flops in synchronization with a clock signal supplied to the flip-flops; and a first delay time adjustment circuit adjusting delay times of paths of the reset signal according to the clock signal, the paths extending from the reset adjustment circuit to the flip-flops; and a second delay time adjustment circuit adjusting delay times of paths of the reset signal using the clock signal as a reference according to setup times and hold times of the reset signal that are prescribed respectively for the reset input pins of the circuit blocks, the paths extending to reset input pins of the circuit blocks.

14. The semiconductor integrated circuit according to claim 13, wherein the reset adjustment circuit comprises:

a first synchronization circuit outputting the reset signal as a first internal signal in synchronization with the clock signal; and a logic operation circuit activating an internal reset signal to be supplied to the flip-flips, in synchronization with the activation transition of the reset signal, and deactivating the internal reset signal in synchronization with deactivation transition of the first internal signal.

15. The semiconductor integrated circuit according to claim 14, wherein:

the reset adjustment circuit includes a second synchronization circuit outputting the first internal signal as a second internal signal in synchronization with the clock signal; and the logic operation circuit receives the second internal signal as the first internal signal.

16. The semiconductor integrated circuit according to claim 13, wherein the reset adjustment circuit includes an internal reset generating circuit that activates an internal reset signal to be supplied to the flip-flops, during activation of the reset signal and outputs a signal fixed at deactivation level of the internal reset signal as the internal reset signal during deactivation of the reset signal in synchronization with the clock signal.

17. A program for designing a semiconductor integrated circuit, comprising:

a first step of causing a computer for designing a semiconductor integrated circuit to insert a reset adjustment circuit immediately after a reset input pin in a semiconductor integrated circuit which has a plurality of flip-flops that are reset in response to activation transition of a reset signal from the reset input pin, the reset adjustment circuit propagating deactivation transition of the reset signal to the flip-flops in synchronization with a clock signal supplied to the flip-flops; and a second step of causing the computer to implement delay time adjustment for paths of the reset signal, using the clock signal as reference, the paths extending from the reset adjustment circuit to the flip-flops.

18. A program for designing a semiconductor integrated circuit, comprising:

a lower hierarchy design step of causing a computer for designing a semiconductor integrated circuit to independently design a plurality of circuit blocks each of which has a plurality of flip-flops that are reset in response to activation transition of a reset signal from a reset input pin; and an upper hierarchy design step of causing the computer to design an entire semiconductor integrated circuit having the plurality of circuit blocks, wherein:

said lower hierarchy design step includes a first step of causing the computer to insert a reset adjustment circuit immediately after the reset input pin in each of the circuit blocks, the reset adjustment circuit propagating deactivation transition of the reset signal to the flip-flops in synchronization with a clock signal supplied to the flip-flops; and a second step of causing the computer to implement timing adjustment for paths of the reset signal, using the clock signal as a reference, the paths extending from the reset adjustment circuit to the flip-flops; and said upper hierarchy design step includes a third step of causing the computer to implement timing adjustment for paths of the reset signal using the clock signal as a reference according to setup times and hold times of the reset signal that are prescribed respectively for the reset input pins of the circuit blocks, the paths extending to the reset input pins of the circuit blocks.

* * * * *